(12) United States Patent
Chung

(10) Patent No.: US 9,252,747 B2
(45) Date of Patent: Feb. 2, 2016

(54) STAGE CIRCUITS AND SCAN DRIVER USING THE SAME

(71) Applicant: Kyung-Hoon Chung, Yongin (KR)

(72) Inventor: Kyung-Hoon Chung, Yongin (KR)

(73) Assignee: SAMSUNG DISPLAY CO., LTD., Yongin, Gyunggi-Do (KR)

( * ) Notice: Subject to any disclaimer, the term of this patent is extended or adjusted under 35 U.S.C. 154(b) by 116 days.

(21) Appl. No.: 13/687,230

(22) Filed: Nov. 28, 2012

(65) Prior Publication Data

US 2013/0321032 A1 Dec. 5, 2013

(30) Foreign Application Priority Data

Jun. 1, 2012 (KR) ........................ 10-2012-0059120

(51) Int. Cl.
*H03K 3/00* (2006.01)
*G09G 3/32* (2006.01)
*G09G 3/00* (2006.01)

(52) U.S. Cl.
CPC ................ *H03K 3/00* (2013.01); *G09G 3/3266* (2013.01); *G09G 3/003* (2013.01); *G09G 2310/0224* (2013.01)

(58) Field of Classification Search
CPC .................. H03K 3/00; G09G 3/3266; G09G 2310/0224; G09G 3/003
See application file for complete search history.

(56) References Cited

U.S. PATENT DOCUMENTS

| | | | |
|---|---|---|---|
| 2007/0008268 A1* | 1/2007 | Park et al. | 345/92 |
| 2007/0124526 A1* | 5/2007 | Sinai | 710/306 |
| 2008/0211797 A1* | 9/2008 | Lee et al. | 345/205 |
| 2010/0253668 A1* | 10/2010 | Sugihara et al. | 345/211 |
| 2010/0328281 A1* | 12/2010 | Okada et al. | 345/206 |
| 2011/0057917 A1* | 3/2011 | Ryu et al. | 345/211 |
| 2011/0157126 A1* | 6/2011 | Chung et al. | 345/211 |
| 2011/0193892 A1* | 8/2011 | Eom | 345/690 |
| 2011/0227883 A1* | 9/2011 | Chung | 345/204 |
| 2011/0227884 A1* | 9/2011 | Chung | 345/204 |
| 2011/0228893 A1* | 9/2011 | Tobita et al. | 377/77 |
| 2011/0273441 A1* | 11/2011 | Shin | 345/419 |
| 2012/0092351 A1* | 4/2012 | Barnes | 345/505 |
| 2013/0002306 A1 | 1/2013 | Chung | |
| 2013/0002307 A1 | 1/2013 | Choi et al. | |
| 2013/0321032 A1* | 12/2013 | Chung | 327/108 |

FOREIGN PATENT DOCUMENTS

| | | |
|---|---|---|
| KR | 10-2007-0022550 A | 2/2007 |
| KR | 10-2013-0003249 | 1/2013 |
| KR | 10-2013-0003250 | 1/2013 |

* cited by examiner

*Primary Examiner* — Aneeta Yodichkas

(74) *Attorney, Agent, or Firm* — Lee & Morse, P.C.

(57) ABSTRACT

There are provided stage circuits and a scan driver using the same, which can supply scan signals using a simultaneous method or an interlace method. Each of the stage circuits includes a progressive driver and a simultaneous driver. The progressive driver outputs a scan signal to an output terminal, corresponding to a plurality of clock signals supplied simultaneously or progressively, and the coupling between the progressive driver and the output terminal is blocked when a third control signal is supplied. The simultaneous driver outputs a scan signal to the output terminal, corresponding to first and second control signals which do not overlap each other, and the coupling between the simultaneous driver and the output terminal is blocked when a fourth control signal, which does not overlap the third control signal, is supplied.

31 Claims, 6 Drawing Sheets

STAGE CIRCUITS AND SCAN DRIVER USING THE SAME

CROSS-REFERENCE TO RELATED APPLICATION

This application claims priority to under 35 U.S.C. §119 and the benefit of Korean Patent Application No. 10-2012-0059120, filed on Jun. 1, 2012, in the Korean Intellectual Property Office, the entire content of which is incorporated herein by reference.

BACKGROUND

1. Field

Embodiments relate to stage circuits and a scan driver using the same, and more particularly, to stage circuits and a scan driver using the same, which can supply scan signals using a simultaneous method or an interlace method.

2. Description of the Related Art

Flat panel display devices, including a liquid crystal display, a field emission display, a plasma display panel, an organic light emitting display, and the like, have been developed. Among these flat panel display devices, the organic light emitting display displays images using organic light emitting diodes that emit light through recombination of electrons and holes. The organic light emitting display has a fast response speed and low power consumption. In a conventional organic light emitting display, current corresponding to a data signal is supplied to an organic light emitting diode using a transistor formed in each pixel, so that the organic light emitting diode emits light.

The conventional organic light emitting display includes a data driver for supplying a data signal to data lines, a scan driver for progressively supplying a scan signal to scan lines, and a pixel unit having a plurality of pixels coupled to the scan lines and the data lines.

When a scan signal is supplied to a scan line, pixels included in the pixel unit are selected to receive a data line supplied from a data line. The pixels that receive the data signal generate light with a predetermined luminance corresponding to the data signal, thereby displaying an image.

SUMMARY

Embodiments provide stage circuits and a scan driver using the same, which can supply scan signals using a simultaneous or interlace method.

According to embodiments, there is provided stage circuits each including: a progressive driver for outputting a scan signal to an output terminal, corresponding to a plurality of clock signals supplied simultaneously or progressively, wherein the coupling between the progressive driver and the output terminal is blocked when a third control signal is supplied; and a simultaneous driver for outputting a scan signal to the output terminal, corresponding to first and second control signals which so not overlap each other, wherein the coupling between the simultaneous driver and the output terminal is blocked when a fourth control signal, which does not overlap the third control signal, is supplied.

A plurality of scan lines may be coupled to the respective stage circuits, the scan signal is progressively supplied to the scan lines when the progressive driver is driven, and the scan signal may be simultaneously supplied to the scan lines when the simultaneous driver is driven. The progressive driver may include a first output unit for controlling a voltage supplied to the output terminal, corresponding to voltages respectively applied to first and second nodes; a second driver for controlling the voltages of the first and second nodes, corresponding to the third control signal supplied to a fifth input terminal; and a first driver for controlling the voltages of the first and second nodes, corresponding to a previous scan signal or start signal supplied to a first input terminal, a first clock signal supplied to a second input terminal and a second clock signal supplied to a third input terminal.

The first output unit may include a first transistor coupled between a high-level first power source and the output terminal, and having a gate electrode coupled to the first node; a second transistor coupled between the output terminal and a fourth input terminal to which a third clock signal is input, and having a gate electrode coupled to the second node; a first capacitor coupled between the second node and the output terminal; and a second capacitor coupled between the first node and the first power source. The first driver may include a third transistor coupled between the high-level first power source and the second node, and having a gate electrode coupled to the first node; a fourth transistor coupled between the first node and a low-level second power source, and having a gate-electrode coupled to the second input terminal; a fifth transistor coupled between the first input terminal and the second node, and having a gate electrode coupled to the third input terminal; and a sixth transistor coupled between the first power source and the first node, and having a gate electrode coupled to the first input terminal. The previous scan signal or start signal may be supplied in synchronization with the second clock signal.

The second driver may include a seventh transistor coupled between the high-level first power source and the second node, and having a gate electrode coupled to the fifth input terminal; and an eighth transistor coupled between the first power source and the first node, and having a gate electrode coupled to the fifth input terminal. The simultaneous driver may include a second output unit for controlling a voltage supplied to the output terminal, corresponding to voltages respectively applied to third and fourth nodes; a third driver for controlling the voltages of the third and fourth nodes, corresponding to the second control signal supplied to a seventh input terminal; a fourth driver for controlling the voltages of the third and fourth nodes, corresponding to the first control signal supplied to a sixth input terminal; and a fifth driver for controlling the voltages of the third and fourth nodes, corresponding to the fourth control signal supplied to an eighth input terminal.

The second output unit may include an eleventh transistor coupled between a high-level power source and the output terminal, and having a gate electrode coupled to the third node; a twelfth transistor coupled between the output terminal and the low-level second power source, and having a gate electrode coupled to the fourth node; a third capacitor coupled between the fourth node and the output terminal; and a fourth capacitor coupled between the third node and the first power source. The third driver may include a fifteenth transistor coupled between the high-level first power source and the fourth node, and having a gate electrode coupled to the seventh input terminal; and a sixteenth transistor coupled between the third node and a low-level second power source, and having a gate electrode coupled to the seventh input terminal. The fourth driver may include a thirteenth transistor coupled between the high-level first power source and the third node, and having a gate electrode coupled to the sixth input terminal; and a fourteenth transistor coupled between the fourth node and the low-level second power source, and having a gate electrode coupled to the sixth input terminal. The fifth driver may include a seventeenth transistor coupled between the high-level first power source and the third node, and having a gate electrode coupled to the eighth input terminal; and an eighteenth transistor coupled between the first power source and the fourth node, and having a gate electrode coupled to the eighth input terminal.

According to embodiments, there is provided a scan driver including stage circuits respectively coupled to scan lines, wherein each of the stage circuits includes a progressive driver for progressively outputting a scan signal to the scan lines, corresponding to clock signals simultaneously or progressively supplied respectively to second, third and fourth input terminals, wherein the coupling between the progressive driver and an output terminal is blocked corresponding to a third control signal supplied to a fifth input terminal; and a simultaneous driver for simultaneously outputting a scan signal to the scan lines, corresponding to a first control signal supplied to a sixth input terminal and a second control signal supplied to a seventh input terminal so as not to overlap the first control signal, wherein the coupling between the simultaneous driver and the output terminal is blocked corresponding to a fourth control signal supplied to an eighth input terminal.

The clock signals may be set to first, second and third clock signals supplied simultaneously or progressively; the second, third and fourth input terminals of an i-th (the i is 1, 2, 7, 8, . . . ) stage may receive the first, second and third clock signals, respectively; the second, third and fourth input terminals of an (i+2)-th stage may receive the second, third and first clock signals, respectively; and the second, third and fourth input terminals of an (i+4)-th stage may receive the third, first and second clock signals, respectively.

The clock signals may be set to first to sixth clock signals supplied simultaneously or progressively; the second, third and fourth input terminals of a k-th (the k is 1, 2, 13, 14, . . . ) stage may receive the first, third and fifth clock signals, respectively; the second, third and fourth input terminals of a (k+2)-th stage may receive the second, fourth and sixth clock signals, respectively; the second, third and fourth input terminals of a (k+4)-th stage may receive the third, fifth and first clock signals, respectively; the second, third and fourth input terminals of a (k+6)-th stage may receive the fourth, sixth and second clock signals, respectively; the second, third and fourth input terminals of a (k+8)-th stage may receive the fifth, first and third clock signals, respectively; and the second, third and fourth input terminals of a (k+10)-th stage may receive the sixth, second and fourth clock signals, respectively.

A clock signal supplied at a specific time when the first to sixth clock signals are progressively supplied may overlap a previously supplied clock signal during a partial period. The progressive driver may further include a first input terminal; odd-numbered stages may receive a first start pulse or scan signal of a previous odd-numbered stage, supplied to the first input terminal; and even-numbered stages may receive a second start pulse or scan signal of a previous even-numbered stage, supplied to the first input terminal. The first or second start pulse may be supplied in synchronization with a pulse supplied to the third input terminal during a period in which the clock signals are progressively supplied. The odd-numbered and even-numbered stages may receive first and second control signals different from each other.

The first control signal supplied to the odd-numbered stages may be supplied during a second period in which the scan signals are simultaneously supplied from the odd-numbered stages, and the second control signal supplied to the odd-numbered stages may be supplied during first and third periods which are prior and posterior to the second period while not overlapping the clock signals; and the second control signal supplied to the even-numbered stages may be supplied during the first to third periods. The first control signal supplied to the even-numbered stages may be supplied during the second period in which the scan signals are simultaneously supplied from the even-numbered stages, and the second control signal supplied to the even-numbered stages may be supplied during the first and third periods which are before and after the second period while not overlapping the clock signals; and the second control signal supplied to the odd-numbered stages may be supplied during the first to third periods. The third control signal may be supplied during the period in which the scan signal is simultaneously supplied to the scan lines, and the fourth control signal may be supplied during the period in which the scan signal is progressively supplied to the scan lines.

DETAILED DESCRIPTION

Figure 1:
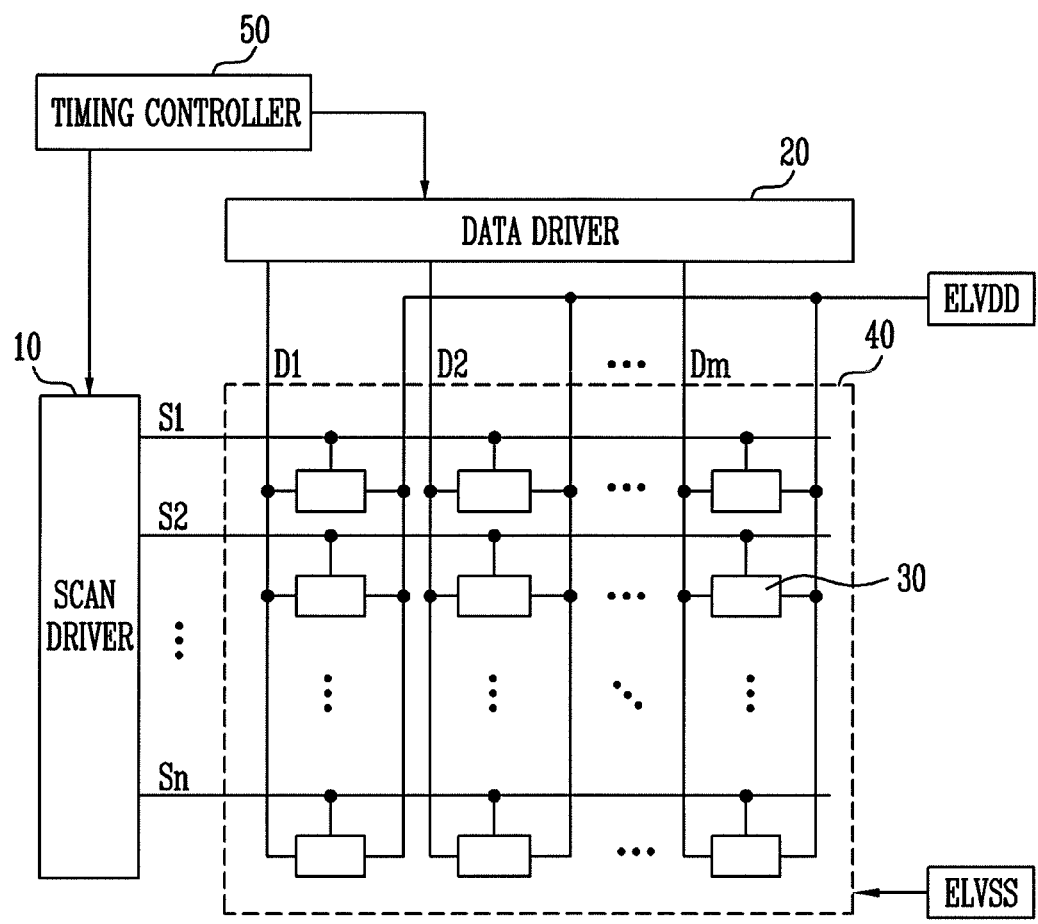
FIG. 1 is a diagram illustrating an organic light emitting display according to an embodiment.

Hereinafter, certain exemplary embodiments will be described with reference to the accompanying drawings. Here, when a first element is described as being coupled to a second element, the first element may be not only directly coupled to the second element but may also be indirectly coupled to the second element via a third element. Further, some of the elements that are not essential to the complete understanding of the detailed description are omitted for clarity. Also, like reference numerals refer to like elements throughout.

FIG. 1 is a diagram illustrating an organic light emitting display according to an embodiment. Referring to FIG. 1, the organic light emitting display according to this embodiment includes a pixel unit 40 having pixels 30 positioned at intersection portions of scan lines S1 to Sn and data lines D1 to Dm; a scan driver 10 for driving the scan lines S1 to Sn; a data driver 20 for driving the data lines D1 to Dm; and a timing controller 50 for controlling the scan driver 10 and the data driver 20.

The scan driver 10 supplies a scan signal to the scan lines S1 to Sn. If the scan signal is supplied to the scan lines S1 to Sn, pixels 30 are selected. Here, the scan driver 10 simultaneously or progressively supplies a scan signal to odd-numbered scan lines S1, S3, . . . during a first driving period of one frame, corresponding to a driving method. The scan driver 10 simultaneously or progressively supplies a scan signal to even-numbered scan lines S2, S4, . . . during a second driving period of the one frame, corresponding to the driving method. To this end, the scan driver 10 includes stage circuits (not shown) respectively coupled to the scan lines S1 to Sn.

The data driver 20 supplies a data signal to the data lines D1 to Dm in synchronization with the scan signal. Here, the data signal is supplied in synchronization with the progressively supplied scan signal.

The timing controller 50 supplies a control signal (not shown) for controlling the scan driver 10 and the data driver 20. The timing controller 50 supplies data (not shown) supplied from the outside thereof to the data driver 20.

Each of the pixels 30 stores a voltage corresponding to the data signal, and generates light with a predetermined luminance while supplying current corresponding to the stored voltage to an organic light emitting diode (not shown).

Figure 2:
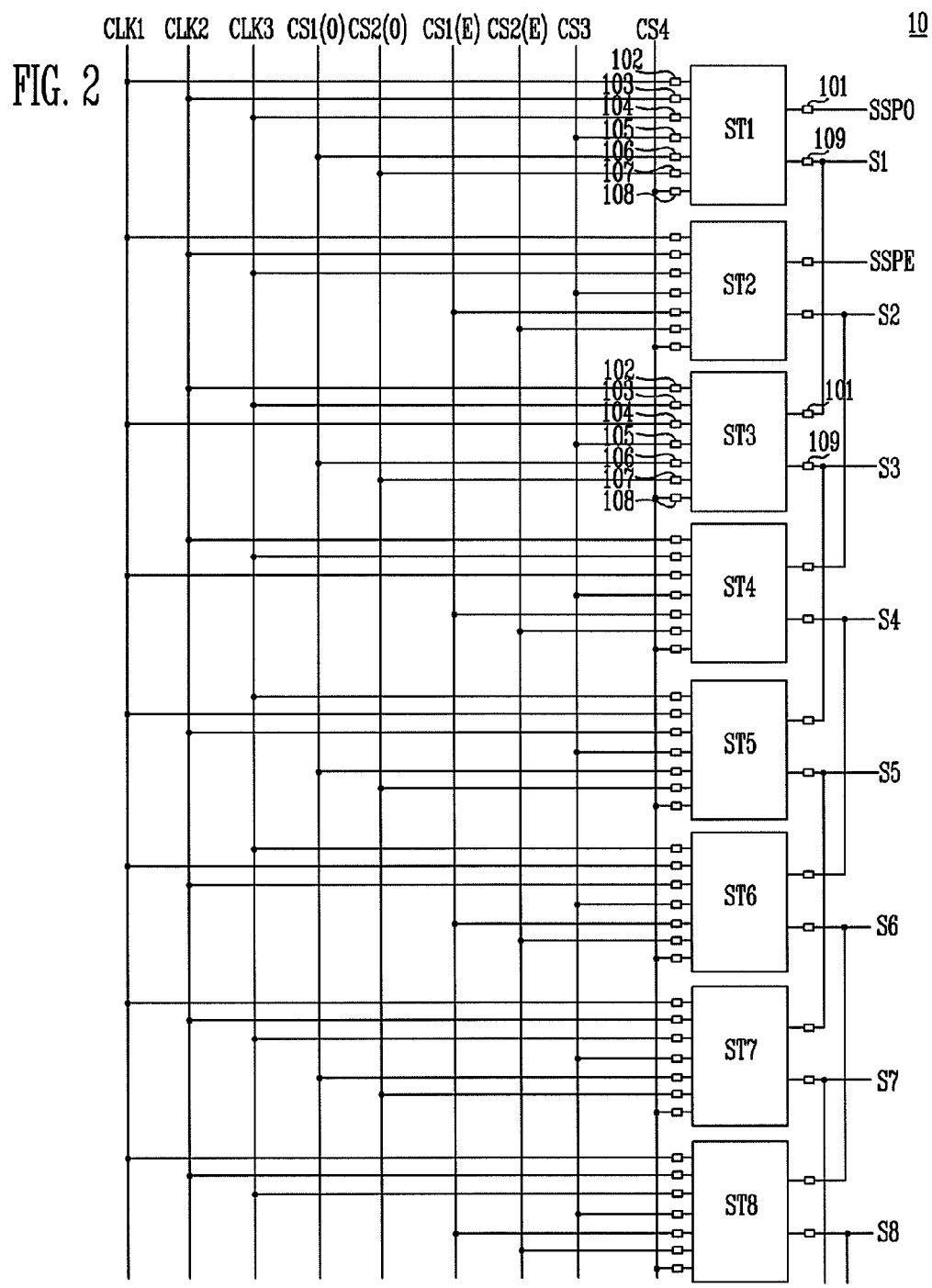
FIG. 2 is a diagram illustrating a first embodiment of a scan driver shown in FIG. 1.

FIG. 2 is a diagram illustrating a first embodiment of the scan driver shown in FIG. 1. For convenience of illustration, eight stages are shown in FIG. 2.

Referring to FIG. 2, the scan driver 10 according to the first embodiment includes stages ST1 to ST8 respectively coupled to scan lines S1 to S8. Each of the stages ST1 to ST8 is coupled to any one of the scan lines S1 to S8, and is driven by clock signals CLK1 to CLK3 and first to fourth control signals CS1 to CS4. The stages ST1 to ST8 are configured as the same circuit.

Here, the clock signals CLK1 to CLK3, the third control signal CS3 and the fourth control signal CS4 are commonly supplied to all the stages ST1 to ST8. The first control signal CS1 is divided into a primary first control signal CS1(O) supplied to odd-numbered stages ST1, ST3, . . . , and a secondary first control signal CS1(E) supplied to even-numbered stages ST2, ST4, . . . . Similarly, the second control signal CS2 is divided into a primary second control signal CS2(O) supplied to the odd-numbered stages ST1, ST3, . . . , and a secondary second control signal CS2(E) supplied to the even-numbered stages ST2, ST4, . . . .

Each of the stages ST1 to ST8 includes first to eighth input terminals 101 to 108 and an output terminal 109.

The second, third and fourth input terminals 102, 103, and 104 of an i-th (the i is 1, 2, 7, 8, . . . ) stage STi receive the first, second, and third clock signals CLK1, CLK2 and CLK3, respectively.

The second, third, and fourth input terminals 102, 103 and 104 of an (i+2)-th stage STi+2 receive the second, third, and first clock signals CLK2, CLK3 and CLK1, respectively.

The second, third, and fourth input terminals 102, 103 and 104 of an (i+4)-th stage STi+4 receive the third, first, and second clock signals CLK3, CLK1 and CLK2, respectively.

The first, second, and third clock signals CLK1, CLK2 and CLK3 are not supplied during a period in which the scan signal is simultaneously supplied (i.e., high level). The first, second, and third clock signals CLK1, CLK2 and CLK3 are simultaneously supplied (i.e., low level) before the scan signal is progressively supplied, and then progressively supplied during a period in which the scan signal is progressively supplied.

When the first, second, and third clock signals CLK1, CLK2 and CLK3 are progressively supplied, the clock signals do not overlap one another (i.e., the low levels of the clock signals do not overlap one another). For example, assuming that the time taken to scan one scan line is one horizontal period (1H), each of the clock signals CLK1, CLK2, and CLK3 has a period of 3H and a duty ratio of 1/3. The phase difference between two adjacent clock signals is 1H. In this case, the other clock signals (e.g., CLK2 and CLK3) are not supplied (i.e., high level) during a period in which one clock signal (e.g., CLK1) is supplied (i.e., low level).

The sixth and seventh input terminals 106 and 107 included in each of the odd-numbered stages ST1, ST3, . . . receive the primary first control signal CS1(O) and the primary second control signal CS2(O), respectively. The first input terminal 101 included in each of the odd-numbered stages ST1, ST3, . . . receives a first start signal SSPO or an output signal (i.e., scan signal) of a previous odd-numbered stage.

The sixth and seventh input terminals 106 and 107 included in each of the even-numbered stages ST2, ST4, . . . receive the secondary first control signal CS1(E) and the secondary second control signal CS2(E), respectively. The first input terminal 101 included in each of the even-numbered stages ST2, ST4, . . . receives a second start signal SSPE or an output signal (i.e., scan signal) of a previous even-numbered stage.

The primary first control signal CS1(O) and the primary second control signal CS2(O) are used to simultaneously supply the control signal to the odd-numbered scan lines S1, S3, . . . . The secondary first control signal CS1(E) and the secondary second control signal CS2(E) are used to simultaneously supply the scan signal to the even-numbered scan lines S2, S4, . . . .

The fifth and eighth input terminals 105 and 108 included in each of all the stages ST1 to ST8 receive the third and fourth control signals CS3 and CS4, respectively. The third and fourth control signals CS3 and CS4 are used to control the simultaneous or progressive supply of the scan signal.

Figure 3:
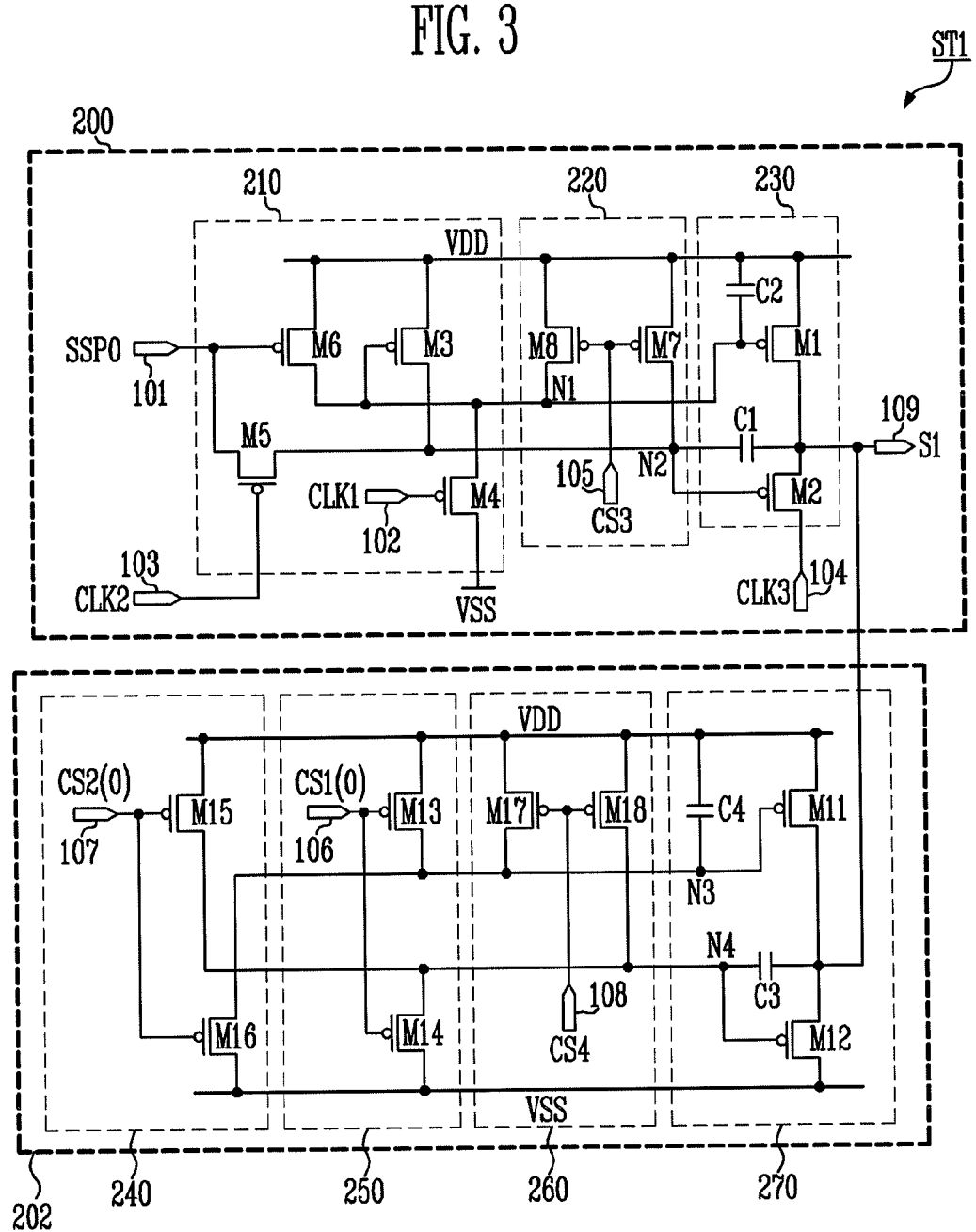
FIG. 3 is a circuit diagram illustrating an embodiment of a stage shown in FIG. 2.

FIG. 3 is a circuit diagram illustrating an embodiment of the stage shown in FIG. 2. For convenience of illustration, the first stage ST1 is shown in FIG. 3. Although it has been illustrated in FIG. 3 that transistors are formed as PMOS transistors, embodiments are not limited thereto. For example, the transistors may be formed as NMOS transistors.

Referring to FIG. 3, the stage ST1 according to the first embodiment includes a progressive driver 200 and a simultaneous driver 202.

The progressive driver 200 outputs a scan signal corresponding to signals respectively supplied to the first, second, third, fourth, and fifth input terminals 101, 102, 103, 014 and 105. The progressive driver 200 is used to progressively supply the scan signal to the odd-numbered scan lines S1, S3, . . . . To this end, the progressive driver 200 includes a first driver 210, a second driver 220, and a first output unit 230.

The first output unit 230 controls a voltage supplied to the output terminal 109 corresponding to voltages respectively applied to first and second nodes N1 and N2. To this end, the first output unit 230 includes a first transistor M1, a second transistor M2, a first capacitor C1, and a second capacitor C2.

The first transistor M1 is coupled between a first power source VDD and the output terminal 109. The first transistor M1 controls the coupling between the first power source VDD and the output terminal 109, corresponding to the voltage applied to the first node N1. Here, the first power source VDD is set to have a gate-off voltage, i.e., a high-level voltage.

The second transistor M2 is coupled between the output terminal 109 and the fourth input terminal 104. The second transistor M2 controls the coupling between the output terminal 109 and the fourth input terminal 104, corresponding to the voltage applied to the second node N2.

The first capacitor C1 is coupled between the second node N2 and the output terminal 109. The first capacitor C1 charges voltages respectively corresponding to the turn-on and turn-off of the second transistor M2.

The second capacitor C2 is coupled between the first node N1 and the first power source VDD. The second capacitor C2 charges the voltage applied to the first node N1.

The first driver 210 controls the voltages respectively applied to the first and second nodes N1 and N2, corresponding to the signals respectively supplied to the first to third input terminals 101 to 103. To this end, the first driver 210 includes third to sixth transistors M3 to M6.

The third transistor M3 is coupled between the first power source VDD and the second node N2. The third transistor M3 controls the voltage of the second node N2, corresponding to the voltage applied to the first node N1.

The fourth transistor M4 is coupled between the first node N1 and a second power source VSS. The fourth transistor M4 controls the coupling between the first node N1 and the second power source VSS, corresponding to the signal (e.g., the first clock signal CLK1) supplied to the second input terminal 102. Here, the second power source VSS is set to have a gate-on voltage, i.e., a low-level voltage.

The fifth transistor M5 is coupled between the first input terminal 101 and the second node N2. The fifth transistor M5 controls the coupling between the first input terminal 101 and the second node N2, corresponding to the signal supplied to the third input terminal 103 (e.g., the second clock signal CLK2).

The sixth transistor M6 is coupled between the first power source VDD and the first node N1. A gate electrode of the sixth transistor M6 is coupled to the first input terminal 101. The sixth transistor M6 controls the coupling between the first power source VDD and the first node N1, corresponding to the signal supplied to the first input terminal 101 (e.g., the first start pulse SSPO).

The second driver 220 controls the voltages respectively applied to the first and second nodes N1 and N2, corresponding to the third control signal CS3 supplied to the fifth input terminal 105. Here, the second driver 220 controls the voltages of the first and second nodes N1 and N2 so that when the third control signal CS3 is supplied, the first and second transistors M1 and M2 are turned off. To this end, the second driver 220 includes a seventh transistor M7 and an eighth transistor M8.

The seventh transistor M7 is coupled between the first power source VDD and the second node N2. The seventh transistor M7 controls the coupling between the first power source VDD and the second node N2, corresponding to the third control signal CS3 supplied to the fifth input terminal 105.

The eighth transistor M8 is coupled between the first power source VDD and the first node N1. The eighth transistor M8 controls the coupling between the first power source VDD and the first node N1, corresponding to the third control signal CS3 supplied to the fifth input terminal 105.

The simultaneous driver 202 controls the output of a scan signal, corresponding to signals respectively supplied to the sixth, seventh, and eighth input terminals 106, 107 and 108. The simultaneous driver 202 is used to simultaneously supply the scan signal to the odd-numbered scan lines S1, S3, . . . (or the odd-numbered scan lines S2, S4, . . . ). To this end, the simultaneous driver 202 includes a third driver 240, a fourth driver 250, a fifth driver 260, and a second output unit 270.

The second output unit 270 controls the voltage supplied to the output terminal 109, corresponding to voltages respectively applied to third and fourth nodes N3 and N4. To this end, the second output unit 270 includes an eleventh transistor M11, a twelfth transistor M12, a third capacitor C3, and a fourth capacitor C4.

The eleventh transistor M11 is coupled between the first power source VDD and the output terminal 109. The eleventh transistor M11 controls the coupling between the first power source VDD and the output terminal 109, corresponding to the voltage applied to the third node N3.

The twelfth transistor M12 is coupled between the output terminal 109 and the second power source VSS. The twelfth transistor M12 controls the coupling between the second power source VSS and the output terminal 109, corresponding to the voltage applied to the fourth terminal N4.

The third capacitor C3 is coupled between the fourth node N4 and the output terminal 109. The third capacitor C3 charges voltages respectively corresponding to the turn-on and turn-off of the twelfth transistor M12.

The fourth capacitor C4 is coupled between the third node N3 and the first power source VDD. The fourth capacitor C4 charges the voltage applied to the third node N3.

The third driver 240 controls the coupling between the third and fourth nodes N3 and N4, corresponding to the primary second signal CS2(O) supplied to the seventh input terminal 107. Here, the third driver 240 controls the voltages of the third and fourth nodes N3 and N4 so that when the primary second control signal CS2(O) is supplied, the eleventh transistor M11 is turned on and the twelfth transistor M12 is turned off.

The fifteenth transistor M15 is coupled between the first power source VDD and the fourth node N4. A gate electrode of the fifteenth transistor M15 is coupled to the seventh input terminal 107. The fifteenth transistor M15 controls the coupling between the fourth node N4 and the first power source VDD, corresponding to the primary second control signal CS2(O) supplied to the seventh input terminal 107.

The sixteenth transistor M16 is coupled between the third node N3 and the second power source VSS. A gate electrode of the sixteenth transistor M16 is coupled to the seventh input terminal 107. The sixteenth transistor M16 controls the coupling between the third node N3 and the second power source VSS, corresponding to the primary second control signal CS2(O) supplied to the seventh input terminal 107.

The fourth driver 250 controls the coupling between the third and fourth nodes N3 and N4, corresponding to the primary first control signal CS1(O) supplied to the sixth input terminal 106. The fourth driver 250 controls the voltages of the third and fourth nodes N3 and N4 so that, when the primary first control signal CS1(O) is supplied, the twelfth transistor M12 is turned on and the eleventh transistor M11 is turned off. To this end, the fourth driver 250 includes a thirteenth transistor M13 and a fourteenth transistor M14.

The thirteenth transistor M13 is coupled between the first power source VDD and the third node N3. A gate electrode of the thirteenth transistor M13 is coupled to the sixth input terminal 106. The thirteenth transistor M13 controls the coupling between the third node N3 and the first power source VDD, corresponding to the primary first control signal CS1 (O) supplied to the sixth input terminal 106.

The fourteenth transistor M14 is coupled between the fourth node N4 and the second power source VSS. A gate electrode of the fourteenth transistor M14 is coupled to the sixth input terminal 106. The fourteenth transistor M14 controls the coupling between the fourth node N4 and the second power source VSS, corresponding to the primary first control signal CS1(O) supplied to the sixth input terminal 106.

The fifth driver 260 controls the voltages respectively applied to the third and fourth nodes N3 and N4, corresponding to the fourth control signal CS4 supplied to the eighth input terminal 108. Here, the fifth driver 260 controls the voltages of the third and fourth nodes N3 and N4 so that when the fourth control signal CS4 is supplied, the eleventh and twelfth transistors M11 and M12 are turned off. To this end, the fifth driver 260 includes a seventeenth transistor M17 and an eighteenth transistor M18.

The seventeenth transistor M17 is coupled between the first power source VDD and the third node N3. The seventeenth transistor M17 controls the coupling between the first power source VDD and the third node N3, corresponding to the fourth control signal CS4 supplied to the eighth input terminal 108.

The eighteenth transistor M18 is coupled between the first power source VDD and the fourth node N4. The eighteenth transistor M18 controls the coupling between the first power source VDD and the fourth node N4, corresponding to the fourth control signal CS4 supplied to the eighth input terminal 108.

Figure 4:
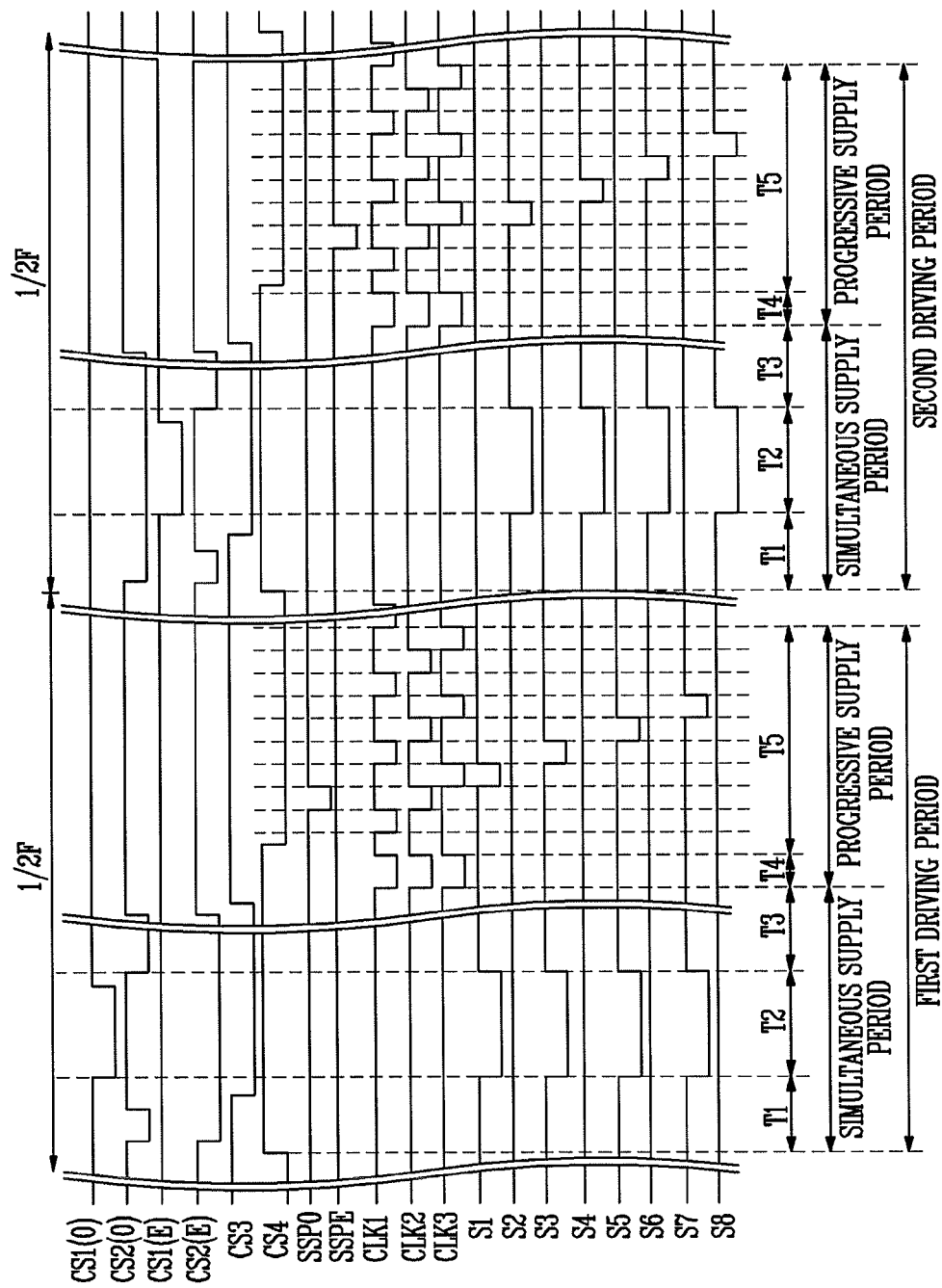
FIG. 4 is a waveform diagram illustrating an embodiment of a driving method of a stage circuit.

FIG. 4 is a waveform diagram illustrating an embodiment of a driving method of the stage circuit.

Referring to FIG. 4, one frame is divided into a first driving period for driving the odd-numbered scan lines S1, S3, . . . , and a second driving period for driving the even-numbered scan lines S2, S4, . . . . In addition, each of the first and second driving periods is divided into a simultaneous supply period and a progressive supply period. Here, a scan signal is simultaneously supplied to the odd-numbered or even-numbered scan lines during the simultaneous supply period, and is progressively supplied to the odd-numbered or even-numbered scan lines during the progressive supply period. The supply periods of waveforms will be described in detail.

The primary first control signal CS1(O) is supplied during a second period T2 in which a scan signal is simultaneously supplied to the odd-numbered scan lines S1, S3, . . . during the first driving period. The secondary first control signal CS1(E) is supplied during a second period T2 in which a scan signal simultaneously supplied to the even-numbered scan lines S2, S4, . . . during the second driving period. That is, if the first control signal CS1 is supplied, the scan signal is simultaneously supplied to the scan lines (the odd-numbered or even-numbered scan lines).

During the first driving period, the primary second control signal CS2(O) is supplied during a first period T1, i.e., before the primary first control signal CS1(O) is supplied, and during a third period T3, i.e., after the primary first control signal CS1(O) is supplied. The secondary second control signal CS2(E) is supplied during the first period T1 before the secondary first control signal CS1(E) is supplied through the third period T3 after the secondary first control signal CS1(E) is supplied. The second control signal CS2 is used to initialize the voltage of the output terminal 109 as the high-level voltage (i.e., the voltage of the first power source VDD).

The third control signal CS3 is supplied during the simultaneous supply period so as to control an output not to be generated from the progressive driver 200. The fourth control signal CS4 is supplied during the simultaneous supply period so as to control an output not to be generated from the simultaneous driver 202. In the third and fourth control signals CS3 and CS4, low-level signals do not overlap each other, so the output terminal 109 is not set to a floating state. That is, the third and fourth control signals CS3 and CS4 are repeatedly supplied so that high-level signals overlap each other during a predetermined period, i.e., partially overlap.

The first to third clock signals CLK1 to CLK3 are simultaneously supplied during a fourth period T4 in the progressive supply period, and are progressively supplied during a fifth period T5. The first to third clock signals CLK1 to CLK3 are used to progressively supply the scan signal to the odd-numbered or even-numbered scan lines.

The first start signal SSPO is supplied in synchronization with a clock signal, i.e., the second clock signal CLK2, supplied to the third input terminal 103 of the progressive driver 200 to which the first start signal SSPO is supplied at a specific time in the fifth period (the first driving period). Similarly, the second start signal SSPE is supplied in synchronization with a clock signal supplied to the third input terminal 103 of the progressive driver 200 to which the first start signal SSPO is supplied at a specific time in the fifth period (the second driving period).

Hereinafter, for convenience of illustration, the operation process of the stage will be described using the first driving period.

The primary second control signal CS2(O) is supplied during the first period T1. If the primary second control signal CS2(O) is supplied, the fifteenth and sixteenth transistors M15 and M16 are turned on. If the fifteenth transistor M15 is turned on, the voltage of the first power source VDD is supplied to the fourth node N4. If the sixteenth transistor M16 is turned on, the voltage of the second power source VSS is supplied to the third node N3. If the voltage of the second power source VSS is supplied to the third node N3, the eleventh transistor M11 is turned on, and accordingly, the voltage (high-level) of the first power source VDD is supplied to the output terminal 109.

Subsequently, the third control signal CS3 and the primary first control signal CS1(O) are supplied during the second period T2. If the third control signal CS3 is supplied, the seventh and eighth transistors M7 and M8 are turned on. If the seventh and eighth transistors M7 and M8 are turned on, the voltage of the first power source VDD is supplied to the first and second nodes N1 and N2, and accordingly, the first and second transistors M1 and M2 are turned off.

If the primary first control signal CS1(O) is supplied, the thirteenth and fourteenth transistors M13 and M14 are turned on. If the thirteenth transistor M13 is turned on, the voltage of the first power source VDD is supplied to the third node N3. If the fourteenth transistor M14 is turned on, the voltage of the second power source VSS is supplied to the fourth node N4. If the voltage of the second power source VSS is supplied to the fourth node N4, the twelfth transistor M12 is turned on, and accordingly, the voltage of the second power source VSS is supplied to the output terminal 109. Here, the primary first control signal CS1(O) is commonly coupled to the odd-numbered stages ST1, ST3, . . . , and hence the scan signal is simultaneously supplied to the odd-numbered scan lines S1, S3, . . . .

Meanwhile, during the second period T2, the third capacitor C3 charges a voltage corresponding to the turn-on of the twelfth transistor M12. Accordingly, although the supply of the primary first control signal CS1(O) is stopped, the twelfth transistor M12 maintains the turn-on state.

During the third period T3, the supply of the third control signal CS3 is maintained, and the primary second control signal CS2(O) is supplied. If the primary second control signal CS2(O) is supplied, the fifteenth and sixteenth transistors M15 and M16 are turned on, and accordingly, the eleventh transistor M11 is turned on so that the voltage of the first power source VDD is supplied to the output terminal 109.

During the fourth period T4, the supply of the third control signal CS3 is stopped, and the first to third clock signals CLK1 to CLK3 are simultaneously supplied. If the supply of the third control signal CS3 is stopped, the seventh and eighth transistors M7 and M8 are turned off.

If the first clock signal CLK1 is supplied, the fourth transistor M4 is turned on. If the fourth transistor M4 is turned on, the voltage of the second power source VSS is supplied to the first node N1. If the second clock signal CLK2 is supplied, the fifth transistor M5 is turned on. If the fifth transistor M5 is turned on, the second node N2 and the first input terminal 101 are electrically coupled to each other. Here, the start signal SSPO is not supplied to the first input terminal 101, and hence the first input terminal 101 is set to have a high-level voltage.

If the voltage of the second power source VSS is supplied to the first node N1 and the high-level voltage is supplied to the second node N2, the first transistor M1 is turned on, and the second transistor M2 is turned off. If the second transistor M2 is turned off, the voltage of the third clock signal CLK3 supplied to the fourth input terminal 104 is not supplied to the output terminal 109. If the first transistor M1 is turned on, the voltage of the first power source VDD is supplied to the output terminal 109.

Subsequently, during the fifth period T5, the fourth control signal CS4 is supplied, and the supply of the first to third clock signals CLK1 to CLK3 is progressively repeated.

If the fourth control signal CS4 is supplied, the seventeenth and eighteenth transistors M17 and M18 are turned on. If the seventeenth and eighteenth transistors M17 and M18 are turned on, the voltage of the first power source VDD is supplied to the third and fourth nodes N3 and N4, and accordingly, the eleventh and twelfth transistors M11 and M12 are set to be in a turn-off state.

When the supply of the first to third clock signals CLK1 to CLK3 are progressively repeated, the first start signal SSPO is supplied in synchronization with the second clock signal CLK2.

If the second clock signal CLK2 is supplied, the fifth transistor M5 is turned on. If the fifth transistor M5 is turned on, the voltage of the first start signal SSPO, i.e., the low-level voltage is supplied to the second node N2. If the low-level voltage is supplied to the second node N2, the second transistor M2 is turned on so that the output terminal 101 and the fourth input terminal 104 are electrically coupled to each other. In this case, the third clock signal CLK3 is not supplied to the fourth input terminal 104, and hence the fourth input terminal 104 maintains the high-level voltage. Accordingly, the high-level voltage is output to the output terminal 109.

Meanwhile, if the first start signal SSPO is supplied, the sixth transistor M6 is turned on, and accordingly, the voltage of the first power source VDD is supplied to the first node N1. If the voltage of the first power source VDD is supplied to the first node N1, the first transistor M1 is turned off.

Subsequently, the third clock signal CLK3 is supplied to the fourth input terminal 104. While being supplied to the fourth input terminal 104, the third clock signal CLK3 is supplied to the output terminal 103 via the second transistor M2. In this case, the scan signal is output to the first scan line S1.

After the third clock signal CLK3 is supplied to the output terminal 109, the first clock signal CLK1 is supplied. If the first clock signal CLK1 is supplied, the fourth transistor M4 is turned on so that the voltage of the second power source VSS is supplied to the first node N1. If the voltage of the second power source VSS is supplied to the first node N1, the first and third transistors M1 and M3 are turned on. If the first transistor M1 is turned on, the voltage of the first power source VDD is supplied to the output terminal 109. If the third transistor M3 is turned on, the voltage of the first power source VDD is supplied to the second node N2 so that the second transistor M2 is set to be in a turn-off state.

Meanwhile, the third stage ST3 receives the output signal of the first stage ST1 in synchronization with the third clock signal CLK3, and accordingly, the scan signal is output to the third scan line S3 in synchronization with the first clock signal CLK1. The fifth stage ST5 receives the output signal of the third stage ST3 in synchronization with the first clock signal CLK1, and accordingly, the scan signal is output to the fifth scan line S5 in synchronization with the second clock signal CLK2.

Practically, the scan driver 10 progressively outputs the scan signal to the odd-numbered scan lines S1, S3, . . . while repeating the process described above.

Meanwhile, the primary second control signal CS2(O) is supplied during the simultaneous supply period in the second driving period. If the primary second control signal CS2(O) is supplied, the fifteenth and sixteenth transistors M15 and M16 are turned on. If the fifteenth transistor M15 is turned on, the voltage of the first power source VDD is supplied to the fourth node N4, and accordingly, the twelfth transistor M12 is turned off. If the sixteenth transistor M16 is turned on, the voltage of the second power source VSS is supplied to the third node N3, and accordingly, the eleventh transistor M11 is turned on. If the eleventh transistor M11 is turned on, the voltage of the first power source VDD is supplied to the output terminal 109.

That is, the odd-numbered stages ST1, ST3, . . . output the voltage of the first power source VDD during the simultaneous supply period in the second driving period. During the second driving period, the scan signal is simultaneously supplied to the even-numbered scan lines S2, S4, . . . , corresponding to the secondary first control signal CS1(E) and the secondary second control signal CS2(E). During the progressive supply period in the second driving period, the scan signal is progressively is supplied to the even-numbered scan lines S2, S4, . . . , corresponding to the second start signal SSPE and the clock signals CLK1 to CLK3. The operation process related to this is the same as that of the odd-numbered scan lines S1, S2, . . . , and therefore, its detailed description will be omitted.

Figure 5:
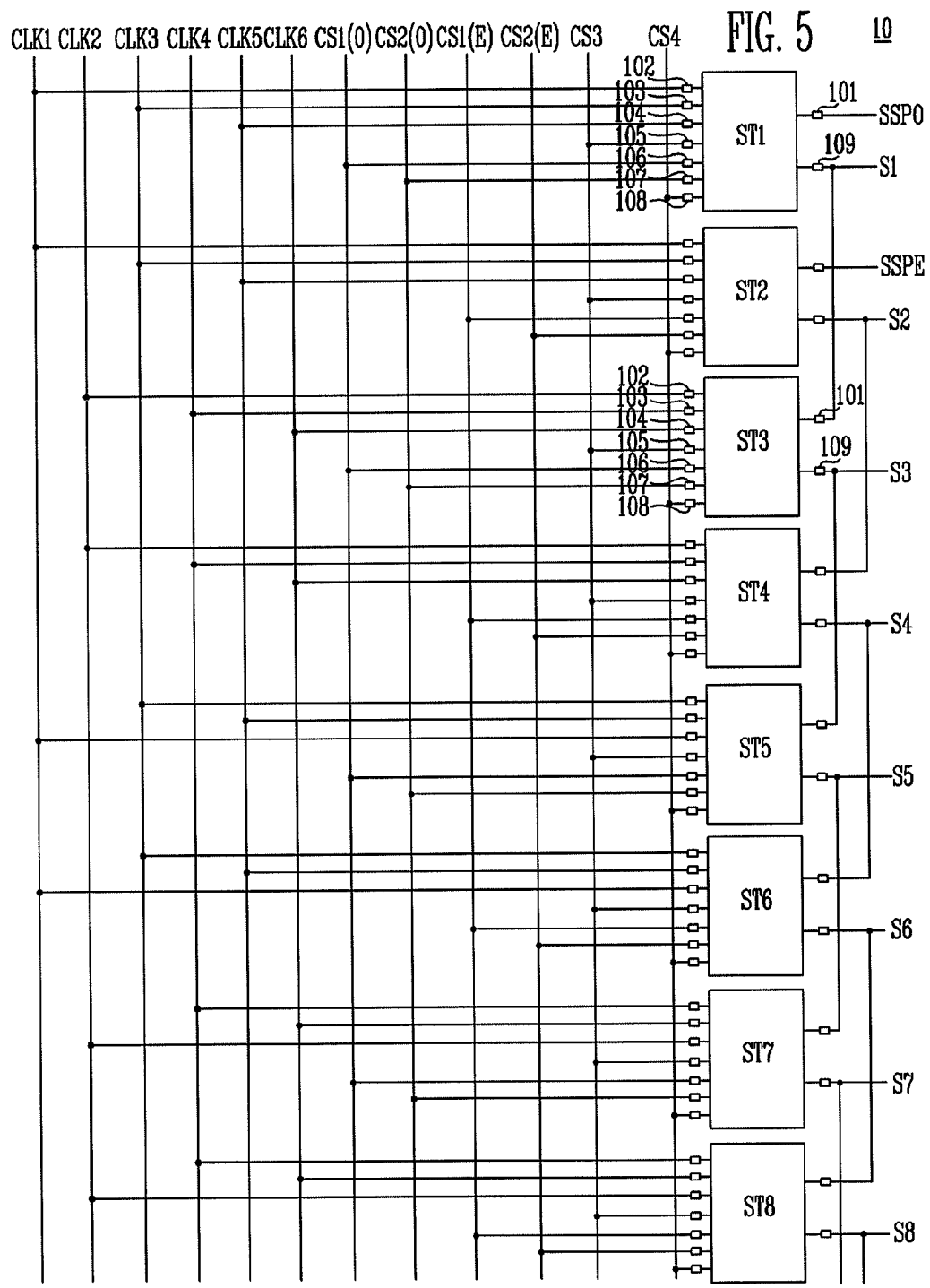
FIG. 5 is a diagram illustrating a second embodiment of the scan driver shown in FIG. 1.

FIG. 5 is a diagram illustrating a second embodiment of the scan driver shown in FIG. 1. For convenience of illustration, eighth stages are shown in FIG. 5. In description of FIG. 5, detailed descriptions of components identical to those of FIG. 2 will be omitted.

Referring to FIG. 5, the scan driver 10 according to the second embodiment supplies six clock signals CLK1 to CLK6 so that the scan signals respectively supplied to a previous scan line (e.g., S1) and a current scan line (e.g., S3) overlap each other during a partial period.

Figure 6:
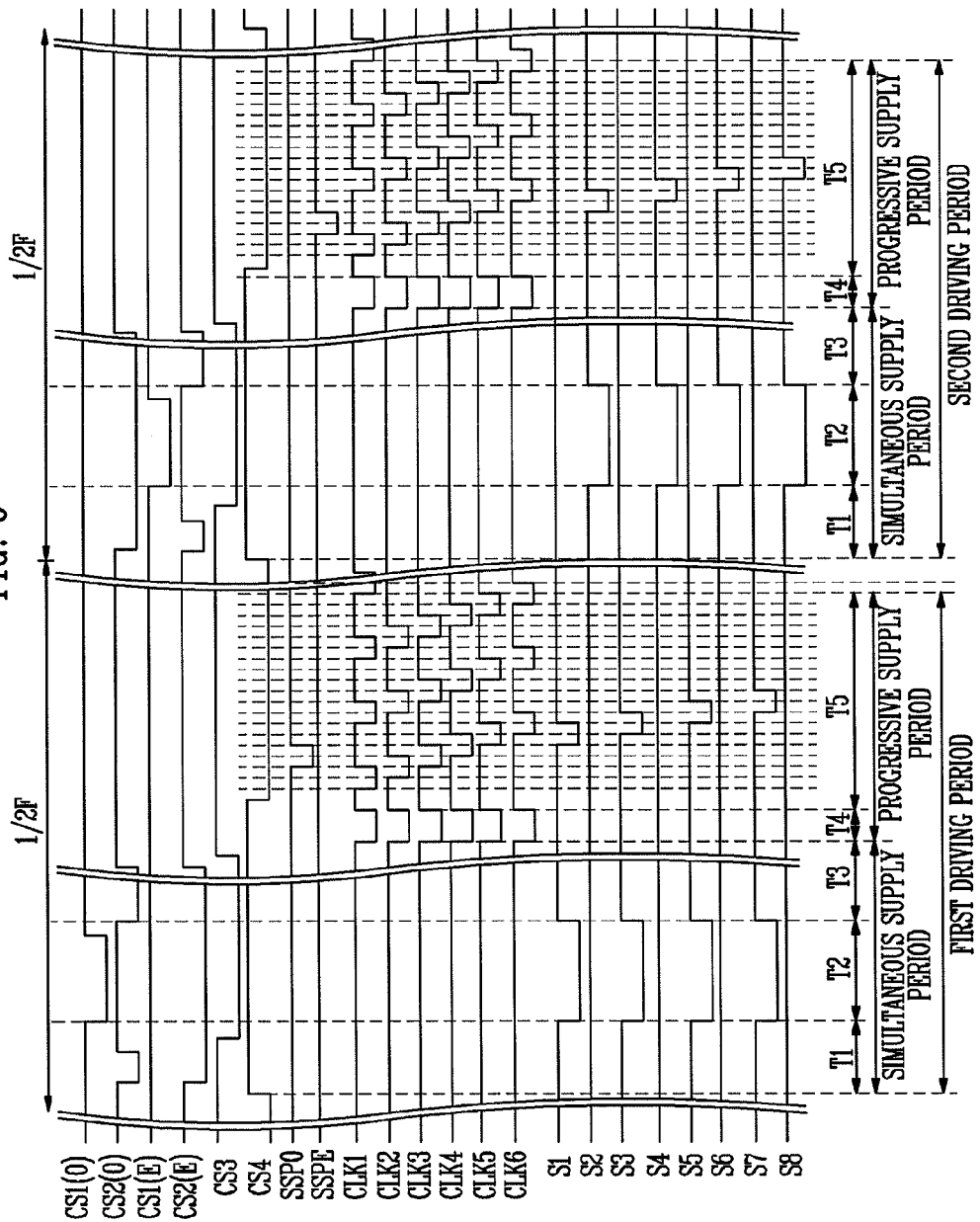
FIG. 6 is a waveform diagram illustrating an embodiment of a driving method of a stage circuit of FIG. 5.

Here, as shown in FIG. 6, the clock signals CLK1 to CLK6 are simultaneously supplied during the fourth period T4 in the simultaneous supply period, and are progressively supplied during the fifth period T5 in the simultaneous supply period. Here, the clock signals CLK1 to CLK6 are supplied for a period of 2H in the fifth period T5, and are supplied so as to overlap an adjacent clock signal for a period of 1H in the fifth period T5.

The second, third, and fourth input terminals 102, 103, and 104 of a k-th (the k is 1, 2, 13, 14, . . . ) stage STk receive the first, third and fifth clock signals CLK1, CLK3, and CLK5, respectively.

The second, third, and fourth input terminals 102, 103, and 104 of a (k+2)-th stage STk+2 receive the second, fourth and sixth clock signals CLK2, CLK4, and CLK6, respectively.

The second, third, and fourth input terminals 102, 103, and 104 of a (k+4)-th stage STk+4 receive the third, fifth and first clock signals CLK3, CLK5, and CLK1, respectively.

The second, third and fourth input terminals 102, 103, and 104 of a (k+6)-th stage STk+6 receive the fourth, sixth and second clock signals CLK4, CLK6, and CLK2, respectively.

The second, third, and fourth input terminals 102, 103, and 104 of a (k+8)-th stage STk+8 receive the fifth, first and third clock signals CLK5, CLK1, and CLK3, respectively.

The second, third and fourth input terminals 102, 103, and 104 of a (k+10)-th stage STk+10 receive the sixth, second and fourth clock signals CLK6, CLK2, and CLK4, respectively.

FIG. 6 is a waveform diagram illustrating an embodiment of a driving method of a stage circuit of FIG. 5. In description of FIG. 6, detailed descriptions of components identical to those of FIG. 4 will be omitted.

Referring to FIG. 6, the clock signals CLK1 to CLK6 are simultaneously supplied during the fourth period T4 in the progressive supply period. Then, the voltage of the first power source VDD is supplied to the output terminal 109 of the stage.

Subsequently, during the fifth period T5, the clock signals CLK1 to CLK6 are progressively supplied so as to overlap a previous clock signal during a predetermined period, e.g., for 1H. The first or second start signal SSPO or SSPE is supplied in synchronization with the third clock signal CLK3.

The start signal SSP is supplied to the first stage ST1 (or the second stage ST2) so as to overlap the third clock signal CLK3. Then, the first stage ST1 (or the second stage ST2) outputs a scan signal to the first scan line S1 (or the second scan line S2) in synchronization with the fifth clock signal CLK5.

The scan signal output to the first scan line S1 (or the second scan line S2) is supplied to the third stage ST3 (or the fourth stage ST4) so as to overlap the fourth clock signal CLK4. Then, the third stage ST3 (or the fourth stage ST4) outputs the scan signal to the third scan line S3 (or the fourth scan line S4) in synchronization with the sixth clock signal CLK6. Here, the fifth and sixth clock signals CLK5 and CLK6 overlap each other during a partial period, and hence the scan signal output to the third scan line S3 overlaps that output to the first scan line S1 during a partial period.

The scan signal output to the third scan line S3 (or the fourth scan line S4) is supplied to the fifth stage ST5 (or the sixth stage ST6) so as to overlap the fifth clock signal CLK5. Then, the fifth stage ST5 (or the sixth stage ST6) outputs the scan signal to the fifth scan line S5 (or the sixth scan line S6) in synchronization with the first clock signal CLK1. Here, the scan signal output to the fifth scan line S5 overlaps that output to the third scan line S3 during a partial period.

By repeating the process described above, the scan driver of the embodiments progressively outputs the scan signal to the odd-numbered scan lines S1, S3, . . . or the even-numbered scan lines S2, S4, . . . so as to overlap the previous scan signal during a partial period.

By way of summation and review, embodiments control the coupling relationship between the stages, so that various types of scan signals may be supplied. Further, the scan signal can be simultaneously supplied to the odd-numbered or even-numbered scan lines during two or more periods in one frame. Thus, as described above, according to embodiments, stage circuits and a scan driver using the same can simultaneously or progressively supply a scan signal to odd-numbered and even-numbered scan lines.

Since an organic light emitting display is driven at a fast response speed, the organic light emitting display is suitable for implementing 3D images. In particular, an organic light emitting display is suitable for implementing a dual view scheme in which watchers wearing shutter glasses can watch different images from each other. By providing a scan driver for simultaneously or progressively supplying a scan signal to odd-numbered and even-numbered scan lines according to embodiments, the dual view scheme can be realized using an organic light emitting display.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. An apparatus comprising a plurality of stage circuits, each stage circuit including:
    a progressive driver to output a scan signal of a display device to an output terminal of the stage circuit, corresponding to a plurality of clock signals supplied simultaneously or progressively, wherein coupling between the progressive driver and the output terminal is blocked when a third control signal is supplied to the stage circuit; and
    a simultaneous driver to output a scan signal of the display device to the output terminal, corresponding to first and second control signals which do not overlap each other, wherein coupling between the simultaneous driver and the output terminal is blocked when a fourth control signal, which does not overlap the third control signal, is supplied to the stage circuit, wherein the first, second, third, and fourth control signals are display control signals for controlling the scan signals from the progressive and simultaneous drivers for generating images on the display device.

2. The apparatus according to claim 1, wherein a plurality of scan lines are coupled to the respective stage circuits, the scan signal is progressively supplied to the scan lines when the progressive driver is driven, and the scan signal is simultaneously supplied to the scan lines when the simultaneous driver is driven.

3. The apparatus according to claim 1, wherein the progressive driver comprises:
    a first output circuit to control a voltage supplied to the output terminal, corresponding to voltages respectively applied to first and second nodes;
    a second driver to control the voltages of the first and second nodes, corresponding to the third control signal supplied to a fifth input terminal; and
    a first driver to control the voltages of the first and second nodes, corresponding to a previous scan signal or start signal supplied to a first input terminal, a first clock signal supplied to a second input terminal and a second clock signal supplied to a third input terminal.

4. The apparatus according to claim 3, wherein the first output circuit comprises:
    a first transistor coupled between a first power source having a high-level and the output terminal, the first transistor having a gate electrode coupled to the first node;
    a second transistor coupled between the output terminal and a fourth input terminal to which a third clock signal is input, the second transistor having a gate electrode coupled to the second node;
    a first capacitor coupled between the second node and the output terminal; and
    a second capacitor coupled between the first node and the first power source.

5. The apparatus according to claim 3, wherein the first driver comprises:
    a third transistor coupled between a first power source having a high-level and the second node, the third transistor having a gate electrode coupled to the first node;
    a fourth transistor coupled between the first node and a second power source having a low-level, the fourth transistor having a gate-electrode coupled to the second input terminal;
    a fifth transistor coupled between the first input terminal and the second node, the fifth transistor having a gate electrode coupled to the third input terminal; and a sixth transistor coupled between the first power source and the first node, the sixth transistor having a gate electrode coupled to the first input terminal.

6. The apparatus according to claim 5, wherein the previous scan signal or start signal is supplied in synchronization with the second clock signal.

7. The apparatus according to claim 3, wherein the second driver comprises:
   a seventh transistor coupled between a first power source having a high-level and the second node, the seventh transistor having a gate electrode coupled to the fifth input terminal; and
   an eighth transistor coupled between the first power source and the first node, the eighth transistor having a gate electrode coupled to the fifth input terminal.

8. The apparatus according to claim 1, wherein the simultaneous driver comprises:
   a second output circuit to control a voltage supplied to the output terminal, corresponding to voltages respectively applied to third and fourth nodes;
   a third driver to control the voltages of the third and fourth nodes, corresponding to the second control signal supplied to a seventh input terminal;
   a fourth driver to control the voltages of the third and fourth nodes, corresponding to the first control signal supplied to a sixth input terminal; and
   a fifth driver to control the voltages of the third and fourth nodes, corresponding to the fourth control signal supplied to an eighth input terminal.

9. The apparatus according to claim 8, wherein the second output circuit comprises:
   an eleventh transistor coupled between a first power source having a high-level and the output terminal, the eleventh transistor having a gate electrode coupled to the third node;
   a twelfth transistor coupled between the output terminal and a low-level second power source, the twelfth transistor having a gate electrode coupled to the fourth node;
   a third capacitor coupled between the fourth node and the output terminal; and
   a fourth capacitor coupled between the third node and the first power source.

10. The apparatus according to claim 8, wherein the third driver comprises:
    a fifteenth transistor coupled between a first power source having a high-level and the fourth node, the fifteenth transistor having a gate electrode coupled to the seventh input terminal; and
    a sixteenth transistor coupled between the third node and a second power source having a low-level, the sixteenth transistor having a gate electrode coupled to the seventh input terminal.

11. The apparatus according to claim 8, wherein the fourth driver comprises:
    a thirteenth transistor coupled between a first power source having a high-level and the third node, the thirteenth transistor having a gate electrode coupled to the sixth input terminal; and
    a fourteenth transistor coupled between the fourth node and a second power source having a low-level, the fourteenth transistor having a gate electrode coupled to the sixth input terminal.

12. The apparatus according to claim 8, wherein the fifth driver comprises:

a seventeenth transistor coupled between a first power source having a high-level and the third node, the seventeenth transistor having a gate electrode coupled to the eighth input terminal; and
    an eighteenth transistor coupled between the first power source and the fourth node, the eighteenth transistor having a gate electrode coupled to the eighth input terminal.

13. A scan driver comprising stage circuits respectively coupled to scan lines, wherein each of the stage circuits comprises:
    a progressive driver to progressively output a scan signal of a display device to the scan lines, corresponding to clock signals simultaneously or progressively supplied respectively to second, third, and fourth input terminals of the stage circuit, wherein the coupling between the progressive driver and an output terminal of the stage circuit is blocked corresponding to a third control signal supplied to a fifth input terminal of the stage circuit; and
    a simultaneous driver to simultaneously output a scan signal of a display device to the scan lines, corresponding to a first control signal supplied to a sixth input terminal of the stage circuit and a second control signal supplied to a seventh input terminal of the stage circuit, the second control signal not overlapping the first control signal, wherein the coupling between the simultaneous driver and the output terminal is blocked corresponding to a fourth control signal supplied to an eighth input terminal of the stage circuit, wherein the first, second, third, and fourth control signals are display control signals for controlling the scan signals from the progressive and simultaneous drivers for generating images on the display device.

14. The scan driver according to claim 13, wherein:
    the clock signals include first, second, and third clock signals supplied simultaneously or progressively;
    the second, third, and fourth input terminals of an i–th (the i is 1, 2, 7, 8, . . .) stage receive the first, second, and third clock signals, respectively;
    the second, third, and fourth input terminals of an (i+2)-th stage receive the second, third, and first clock signals, respectively; and
    the second, third, and fourth input terminals of an (i+4)-th stage receive the third, first, and second clock signals, respectively.

15. The scan driver according to claim 13, wherein:
    the clock signals include first to sixth clock signals supplied simultaneously or progressively;
    the second, third, and fourth input terminals of a k–th (the k is 1, 2, 13, 14, . . .) stage receive the first, third, and fifth clock signals, respectively;
    the second, third, and fourth input terminals of a (k+2)-th stage receive the second, fourth, and sixth clock signals, respectively;
    the second, third, and fourth input terminals of a (k+4)-th stage receive the third, fifth, and first clock signals, respectively;
    the second, third, and fourth input terminals of a (k+6)-th stage receive the fourth, sixth, and second clock signals, respectively;
    the second, third, and fourth input terminals of a (k+8)-th stage receive the fifth, first, and third clock signals, respectively; and
    the second, third, and fourth input terminals of a (k+10)-th stage receive the sixth, second, and fourth clock signals, respectively.

16. The scan driver according to claim 15, wherein a clock signal supplied at a specific time when the first to sixth clock signals are progressively supplied overlaps a previously supplied clock signal during a partial period.

17. The scan driver according to claim 13, wherein:
the progressive driver further comprises a first input terminal;
odd-numbered stages receive a first start pulse or scan signal of a previous odd-numbered stage supplied to the first input terminal; and
even-numbered stages receive a second start pulse or scan signal of a previous even-numbered stage supplied to the first input terminal.

18. The scan driver according to claim 17, wherein the first or second start pulse is supplied in synchronization with a pulse supplied to the third input terminal during a period in which the clock signals are progressively supplied.

19. The scan driver according to claim 17, wherein the simultaneous driver comprises:
a second output circuit to control a voltage supplied to the output terminal, corresponding to voltages respectively applied to third and fourth nodes;
a third driver to control the voltages of the third and fourth nodes, corresponding to the second control signal;
a fourth driver to control the voltages of the third and fourth nodes, corresponding to the first control signal; and
a fifth driver to control the voltages of the third and fourth nodes, corresponding to the fourth control signal.

20. The scan driver according to claim 19, wherein the second output circuit comprises:
an eleventh transistor coupled between a first power source having a high-level and the output terminal, the eleventh transistor having a gate electrode coupled to the third node;
a twelfth transistor coupled between the output terminal and a second power source having a low-level, the twelfth transistor having a gate electrode coupled to the fourth node;
a third capacitor coupled between the fourth node and the output terminal; and
a fourth capacitor coupled between the third node and the first power source.

21. The scan driver according to claim 19, wherein the third driver comprises:
a fifteenth transistor coupled between a first power source having a high-level and the fourth node, the fifteenth transistor having a gate electrode coupled to the seventh input terminal; and
a sixteenth transistor coupled between the third node and a second power source having a low-level, the sixteenth transistor having a gate electrode coupled to the seventh input terminal.

22. The scan driver according to claim 19, wherein the fourth driver comprises:
a thirteenth transistor coupled between a first power source having a high-level and the third node, the thirteenth transistor having a gate electrode coupled to the sixth input terminal; and
a fourteenth transistor coupled between the fourth node and a second power source having a low-level, the fourteenth transistor having a gate electrode coupled to the sixth input terminal.

23. The scan driver according to claim 19, wherein the fifth driver comprises:

a seventeenth transistor between a first power source having a high-level and the third node, the seventeenth transistor having a gate electrode coupled to the eighth input terminal; and
an eighteenth transistor coupled between the first power source and the fourth node, the eighteenth transistor having a gate electrode coupled to the eighth input terminal.

24. The scan driver according to claim 13, wherein the odd-numbered and even-numbered stages receive first and second control signals different from each other.

25. The scan driver according to claim 24, wherein:
the first control signal supplied to the odd-numbered stages is supplied during a second period in which the scan signals are simultaneously supplied from the odd-numbered stages;
the second control signal supplied to the odd-numbered stages is supplied during first and third periods which are before and after the second period while not overlapping the clock signals; and
the second control signal supplied to the even-numbered stages is supplied during the first to third periods.

26. The scan driver according to claim 24, wherein:
the first control signal supplied to the even-numbered stages is supplied during a second period in which the scan signals are simultaneously supplied from the even-numbered stages;
the second control signal supplied to the even-numbered stages is supplied during first and third periods which are before and after the second period while not overlapping with the clock signals; and
the second control signal supplied to the odd-numbered stages is supplied during the first to third periods.

27. The scan driver according to claim 13, wherein:
the third control signal is supplied during the period in which the scan signal is simultaneously supplied to the scan lines; and
the fourth control signal is supplied during the period in which the scan signal is progressively supplied to the scan lines.

28. The scan driver according to claim 13, wherein the progressive driver comprises:
a first input terminal;
a first output circuit to control a voltage supplied to the output terminal, corresponding to voltages respectively applied to first and second nodes;
a second driver to control the voltages of the first and second nodes, corresponding to the third control signal; and
a first driver to control the voltages of the first and second nodes, corresponding to the signal supplied to the first input terminal, the first clock signal and the second clock signal.

29. The scan driver according to claim 28, wherein the first output circuit comprises:
a first transistor coupled between a first power source having a high-level and the output terminal, the first transistor having a gate electrode coupled to the first node;
a second transistor coupled between the fourth input terminal and the output terminal, the second transistor having a gate electrode coupled to the second node;
a first capacitor coupled between the second node and the output terminal; and
a second capacitor coupled between the first node and the first power source.

30. The scan driver according to claim 28, wherein the first driver comprises:

a third transistor coupled between a first power source having a high-level and the second node, the third transistor having a gate electrode coupled to the first node;

a fourth transistor coupled between the first node and a second power source having a low-level, the fourth transistor having a gate electrode coupled to the second input terminal;

a fifth transistor coupled between the first input terminal and the second node, the fifth transistor having a gate electrode coupled to the third input terminal; and a sixth transistor coupled between the first power source and the first node, the sixth transistor having a gate electrode coupled to the first input terminal.

31. The scan driver according to claim 28, wherein the second driver comprises:

a seventh transistor coupled between a first power source having a high-level and the second node, the seventh transistor having a gate electrode coupled to the fifth input terminal; and an eighth transistor coupled between the first power source and the first node, the eighth transistor having a gate electrode coupled to the fifth input terminal.

* * * * *